US010253253B2

(12) United States Patent
Murase et al.

(10) Patent No.: US 10,253,253 B2
(45) Date of Patent: Apr. 9, 2019

(54) FLUORESCENT PARTICLE, WITH SEMICONDUCTOR NANOPARTICLES DISPERSED THEREIN, FABRICATED BY THE SOL-GEL PROCESS

(71) Applicant: NATIONAL INSTITUTE OF ADVANCED INDUSTRIAL SCIENCE AND TECHNOLOGY, Tokyo (JP)

(72) Inventors: Norio Murase, Ikeda (JP); Ping Yang, Ikeda (JP); Masanori Ando, Ikeda (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 121 days.

(21) Appl. No.: 15/221,805

(22) Filed: Jul. 28, 2016

(65) Prior Publication Data
US 2016/0333265 A1    Nov. 17, 2016

Related U.S. Application Data

(62) Division of application No. 13/518,966, filed as application No. PCT/JP2010/072777 on Dec. 17, 2010.

(30) Foreign Application Priority Data

Dec. 28, 2009  (JP) ................................ 2009-296596
May 12, 2010  (JP) ................................ 2010-109885

(51) Int. Cl.
*C09K 11/02*   (2006.01)
*C09K 11/56*   (2006.01)
(Continued)

(52) U.S. Cl.
CPC .......... *C09K 11/025* (2013.01); *C09K 11/565* (2013.01); *C09K 11/883* (2013.01);
(Continued)

(58) Field of Classification Search
CPC . C09K 11/025; C09K 11/0811; C09K 11/883; Y10S 977/779; Y10S 977/774; Y10S 977/824
See application file for complete search history.

(56) References Cited

U.S. PATENT DOCUMENTS

2006/0097624 A1  5/2006  Murase et al.
2007/0075294 A1  4/2007  Murase et al.
(Continued)

FOREIGN PATENT DOCUMENTS

JP   2000-275180 A   10/2000
JP   3677538 B2       5/2005
(Continued)

OTHER PUBLICATIONS

EP 10840895.6: Supplementary European Search Report dated Oct. 1, 2013.
(Continued)

*Primary Examiner* — C Melissa Koslow
(74) *Attorney, Agent, or Firm* — Kratz, Quintos & Hanson, LLP

(57) ABSTRACT

An object of the present invention is to prepare a fine particle with high durability and high brightness, in which semiconductor nanoparticles are assembled. The present invention provides fluorescent fine particles comprising Cd- and Se-containing semiconductor nanoparticles dispersed in silicon-containing fine particles, wherein the average particle size of the silicon-containing fine particles is 20 to 100 nm, and the number of semiconductor nanoparticles dispersed in the silicon-containing fine particles is 10 or more.

5 Claims, 7 Drawing Sheets

(51) Int. Cl.
   *C09K 11/88*    (2006.01)
   *H01L 33/00*    (2010.01)
(52) U.S. Cl.
   CPC ....... *H01L 33/0083* (2013.01); *Y10S 977/774* (2013.01); *Y10S 977/779* (2013.01); *Y10S 977/824* (2013.01)

(56) References Cited

U.S. PATENT DOCUMENTS

| | | |
|---|---|---|
| 2008/0213558 A1 | 9/2008 | Murase et al. |
| 2009/0108235 A1 | 4/2009 | Ando et al. |

FOREIGN PATENT DOCUMENTS

| | | |
|---|---|---|
| JP | 2005-281019 A | 10/2005 |
| JP | 3755033 B2 | 1/2006 |
| JP | 2006-282977 A | 10/2006 |
| WO | 2007/034877 A1 | 3/2007 |

OTHER PUBLICATIONS

Chan, Yinthai, et al., "Incorporation of Luminescent Nanocrystals into Monodisperse Core-Shell Silica Microspheres", Advanced Materials, Dec. 17, 2004, vol. 16, No. 23-24, pp. 2092-2097.

Chu, Maoquan, et al., "Silica-coated quantum dots fluorescent spheres synthesized using a quaternary 'water-in-oil' microemulsion system", Journal of Nanoparticle Research, vol. 10, Sep. 5, 2007, pp. 613-624.

Gerion, Daniele, et al., "Synthesis and Properties of Biocompatible Water-Soluble Silica-Coated CdSe/ZnS Semiconductor Quantum Dots", Journal of Physical Chemistry B, vol. 105, No. 37, Apr. 17, 2001, pp. 8861-8871.

Graf, Christina, et al., "A General method for the Controlled Embedding of Nanoparticles in Silica Colloids," Langmuir, vol. 22, No. 13 (2006), pp. 5604-5610.

Jana, Nikhil R., et al., "Synthesis of Water-Soluble and Functionalized Nanoparticles by Silica Coating," Chemistry of Materials, vol. 19, No. 21 (2007), pp. 5074-5082.

Kogyo, Kagaku, "Preparation of Glass Phospors in which Semiconductor Nanoparticles are dispersed", Kagaku Kogyo, Sep. 2007, pp. 707-714, with English translation.

Koole, Rolf, et al., "On the Incorporation Mechanism of Hydrophobic Quantum Dots in Silica Spheres by a Reverse Microemulsion Method", Chemistry of Materials, vol. 20, No. 7, Jan. 16, 2008, pp. 2503-2512.

Nann, Thomas, et al., "Single Quantum Dots in Spherical Silica Particles", Angewandte Chemie, International Edition, 2004, vol. 43, pp. 5393-5396.

Rogach, Andrey, et al., "'Raisin Bun'-Type Composite Spheres of Silica and Semiconductor Nanocrystals", Chemistry of Materials, vol. 12, No. 9, Jun. 27, 2000, pp. 2676-2685.

Selvan, S. Tamil, et al., "Robust, Non-Cytotoxic, Silica-Coated CdSe Quantum Dots with Efficient Photoluminescence," Advanced Materials, vol. 17 (2005), pp. 1620-1625.

Talapin, Dmitri V. et al., Synthesis and surface modification of amino-stabilized CdSe, CdTe and InP nanocrystals, Colloids and Surfaces A: Physicochemical and Engineering Aspects 202 (2002) 145-154.

Yang, Jian, et al., "Quantum Dot Nanobarcodes: Epitaxial Assembly of Nanoparticle-Polymer Complexes in Homogeneous Solution", Journal of America! Chemical Society, vol. 130, Feb. 16, 2008, pp. 5286-5292.

Zhou, Xingping et al., "Preparation of silica encapsulated CdSe quantum dots in aqueous solution with the improved optical properties," Applied Surface Science, vol. 242 (2005), pp. 281-286.

Step 1: Silanization of CdSe/ZnS Nanoparticle Surface

Step 2: Phase Transition and Formation of Assembly of Silanized CdSe/ZnS Nanoparticles Top right: Aggregate formation → Assembly formation
Bottom right: Aggregate as a core → Assembly as a seed Step 3: Growth of Silica Shell by Stöber Method Left: aggregate as cores → assemblies as seeds Concentration of Water in the Reaction Solution and
PL Efficiency of Nanoparticles $H_2O$ concentration/$10^{-3}$ M Left (vertical axis): Luminous efficiency → PL efficiency

FLUORESCENT PARTICLE, WITH SEMICONDUCTOR NANOPARTICLES DISPERSED THEREIN, FABRICATED BY THE SOL-GEL PROCESS

This application is a divisional application of U.S. patent application Ser. No. 13/518,966, filed Aug. 14, 2012, which is a 371 application of PCT/JP2010/072777, filed Dec. 17, 2010, which claims priority to JP 2009-296596, filed Dec. 28, 2009, and JP 2010-109885, filed May 12, 2010, all of which are incorporated herein by reference.

TECHNICAL FIELD

The present invention relates to a method for preparing highly durable silica glass fine particles in which numerous semiconductor nanoparticles with high photoluminescence (PL) efficiency are dispersed therein, and an application thereof.

BACKGROUND ART

Because fluorescent materials (phosphors) obtained by dispersing rare-earth ions, transition metal ions, and the like in inorganic materials have better durability than organic dyes, these fluorescent materials have been conventionally used for lights, displays, and the like. However, because the brightness and color-rendering properties thereof are not always sufficient, there has been a demand for a fluorescent material with higher brightness. In recent years, semiconductor nanoparticles (particle size of several nanometers; without doping of rare-earth ions or transition metal ions; hereinafter also simply referred to as "nanoparticles" or "quantum dots") are gaining attention as a high-performance fluorescent material that embodies the above demand because of the following reasons: semiconductor nanoparticles are excellent in color-rendering properties because these particles emit bright fluorescence of various wavelengths according to the particle size even when irradiated with ultraviolet light of the same wavelength, and the brightness of these nanoparticles can be increased because their emission decay time is short. If semiconductor nanoparticles are carefully prepared, the brightness becomes high to the degree that the emission of each particle can be separately detected and spectroscopically analyzed. Consequently, in addition to the use for displays and light, there is the beginning of a great development in the field of application where semiconductor nanoparticles are conjugated to biomolecules and used as fluorescent probes for the elucidation of the mechanism of the life, the diagnosis of diseases, and the like.

Primary examples of semiconductors that serve as the above-described fluorescent materials include II-VI semiconductors (cadmium sulfide (CdS), zinc selenide (ZnSe), cadmium selenide (CdSe), zinc telluride (ZnTe), cadmium telluride (CdTe), mixed crystals thereof, etc.) and III-V semiconductors (indium phosphide (InP), etc.). These are direct transition semiconductors, and their emission lifetime is about 10 nanoseconds, which is about five orders of magnitude smaller than conventional forbidden transition fluorescent materials that use a rare-earth ions or transition metal ions. Consequently, fluorescence with much higher brightness can be achieved.

There are two synthesis methods for semiconductor nanoparticles that emit such high-intensity light (fluorescence): one method for synthesizing in an aqueous solution (hydrophilic nanoparticles are synthesized), and another method for synthesizing in an organic solution (non-polar solvent) in which water is removed at a high level (hydrophobic nanoparticles are synthesized). Because nanoparticles have a large specific surface area, these nanoparticles are gradually agglomerated in the solution in order to reduce the surface energy, and the PL efficiency is thus decreased. Therefore, there was a problem with the nanoparticles synthesized by both methods in that it was difficult to put them to practical use when these nanoparticles were in the form of a solution. In order to solve this problem, semiconductor nanoparticles must be incorporated in a transparent matrix in such a manner that the nanoparticles are dispersed and fixed therein so as to obtain a solid material that maintains the initial properties for a long period of time under various environments. As a solid matrix therefor, there are two materials: glass, and organic polymer materials. Between these, glass, particularly silica glass, has a higher transparency and a higher tolerance to ultraviolet irradiation than organic polymers. Additionally, moisture and oxygen cannot easily permeate through silica glass when silica glass is formed in a network structure, making it possible to prevent degradation of dispersed nanoparticles for a long period of time. A sol-gel method is favorable for the preparation of such glass because in the sol-gel method, vitrification progresses under mild conditions at or close to normal temperature and pressure; thus, if a preparation method is improved, semiconductor nanoparticles can be dispersed and fixed in a transparent glass while maintaining high PL efficiency that was achieved immediately after synthesis by the solution method. Because the sol-gel method uses water, it is preferable to use hydrophilic nanoparticles from the viewpoint of preventing agglomeration and quenching.

The term "silica glass" is explained here. Although glass prepared by the sol-gel method contains an organic materials and water, such a product is called glass, silica, silica glass, silica-based glass, amorphous silica, $SiO_2$, etc., in related scientific societies. This is because other metal ions that modify the network structure formed by silicon are not contained in the prepared solid matrix. Therefore, a matrix containing silicon prepared by the sol-gel method is also called glass, silica, or silica glass in the present description.

The present inventors developed a bulk-like glass (Patent Literature 1), glass fine particles (Patent Literature 2, 3, and 4), and a glass thin film (Patent Literature 5) as the fluorescent glass described above. Of these, glass fine particles (particle size of 10 nm to 2 μm; when the particle is not a complete sphere, for example, a rugby ball shape (spheroid elongated in the direction of the symmetrical axis), pancake shape (flattened spheroid), and the like, the average length of three principal axes of inertia is defined as the particle size in the present description; when the particle is a complete sphere, the diameter is the particle size) can be used as powdered fluorescent material for light-emitting devices such as displays, lights, and the like. In addition, such glass fine particles have an important application as fluorescent probes by being bound to biomolecules. The description is given below, by limiting to the fluorescent silica glass fine particles.

In Patent Literature 2, 3, and 4 of the present inventors, the sol-gel method in which alkoxide is hydrolyzed and dehydration-condensed is used. In particular, a reverse micelle method (a method in which the sol-gel method is performed in minute water droplets dispersed in the oil phase, wherein water-dispersible nanoparticles are dispersed in the water droplets in advance) or Stöber method (a method in which hydrolyzed alkoxide is deposited on the nanoparticle surface) was used to develop a technology to disperse multiple semiconductor nanoparticles in silica glass fine particles with high PL efficiency (25% or higher).

However, when the prepared silica glass fine particles are applied as fluorescent probes in the field of biotechnology, conditions for the evaluation of fluorescence properties are usually significantly different from when the particles are prepared as usual phosphor such as for light-emitting materials.

Because silica glass fine particles have less scattering when the particle size is about 100 nm or less, the particles are introduced into a quartz cell having a light path of 1 cm while being dispersed in a solution, and the quartz cell is measured using an absorption spectrophotometer and a fluorescence spectrophotometer for general purposes. Thereby, the absorbance and the fluorescence intensity of each wavelength are determined. An integrating sphere is used when the influence of scattering is a concern; however, in this case, there is an increase in errors in both absorbance and fluorescence intensity, compared to the case where there is no scattering. Also in this case, general-purpose measurement devices have recently been commercially available (for example, C9920-02 by Hamamatsu Photonics K.K.).

The concentration of semiconductor nanoparticles just after synthesis is usually about 1 to about 10 μM (μmol/L; this indicates the number of semiconductor nanoparticles, rather than the number of atoms constituting the nanoparticles). These particles are stored as-is in a cool, dark space. When measuring the PL efficiency, the concentration is diluted to about 200 to about 300 nM because the above concentration is too high. Consequently, the signal level that can be most easily measured using a general-purpose absorption spectrophotometer or fluorescence spectrophotometer is obtained. Pure water is often used as the solvent. On the other hand, when semiconductor nanoparticles are applied as fluorescent probes, the fluorescence is often separately detected from one or several nanoparticles; and in that case, the nanoparticle concentration is about 10 nM at most, and the nanoparticles are dispersed in a highly concentrated salt solution such as saline. Further, the irradiated light intensity is also usually 10 W/cm$^2$ or greater, which is more intense compared to irradiated light intensity when measuring using a spectrometer by a different order of magnitude. In this way, it became clear that, in terms of material synthesis as described above, when the concentration of dispersed nanoparticles is extremely low and a large amount of salts are contained in the solution, there is a case where nanoparticles are degraded even if glass is used for coating of the nanoparticles. In order to prevent such degradation, developing a glass network structure is one effective means. Further, it is more preferable, from the viewpoint of increasing the brightness, to incorporate multiple nanoparticles in glass to form one glass fluorescent fine particle than to coat glass with one nanoparticle.

As described later, the present inventors found that, among the nanoparticles described in Patent Literature 2 to 4 above, it is effective to use nanoparticles containing Cd and Se, for example, CdSe nanoparticles, in order to prevent degradation. However, CdSe nanoparticles having high PL efficiency are prepared by an organic solution method in which water is removed at a high level, and the CdSe nanoparticles are quenched when they are dispersed as-is in an aqueous solution. Therefore, it is desirable to disperse CdSe nanoparticles in glass fine particles while maintaining the PL efficiency thereof. In particular, it is desirable to disperse numerous nanoparticles in order to increase the brightness as much as possible.

Further, in the search of a possible application in the field of biotechnology, it became clear that fluorescent fine particles having a particle size of 100 nm or less are effective. Cells are typically 10 to 30 μm in size, and when the particle size exceeds 100 nm, the possibility of the particles being internalized by cells through phagocytosis decreases. Further, when the cell interior is stained in various colors, the particle size of over 100 nm and close to 200 nm is not suitable for clear staining, because the shape thereof can be seen under the optical microscope when the particle size is in that range. On the other hand, the particle size of semiconductor nanoparticles is a few to several nanometers, and fine particles in which 10 or more nanoparticles are dispersed are necessary in order to increase the brightness by a different order of magnitude. In order to do so, the particle size must be about 20 nm or more.

Next, the present inventors examined particles known as silica glass fine particles in which nanoparticles containing Cd and Se are dispersed, and the emission properties thereof.

Bawendi et al. reported fluorescent silica glass fine particles in which CdSe/ZnS nanoparticles are dispersed and fixed in glass by the sol-gel method, and a method for preparing the particles (Non-Patent Literature 1). This preparation method is a method in which the surface of nanoparticles that have been synthesized in an organic solvent in advance is coated with alkoxide having an amino group (3-aminopropyltrimethoxysilane) and alcohol having an amino group (5-amino-1-pentanol), and the resulting product is bound as a layer having a thickness of about 50 nm to the surface of separately prepared silica glass fine particles having a diameter of about a few hundred nanometers. This method provides fluorescent glass fine particles having a structure in which the surface of silica glass fine particles not containing nanoparticles is coated with a sol-gel glass layer containing nanoparticles. However, because the nanoparticles are present only around and on the surface of the glass fine particles, and no nanoparticles are contained in the core of the glass fine particles, it was not possible to increase the concentration of dispersed nanoparticles in the glass fine particles. Additionally, the PL efficiency was about 13%.

As another preparation method, a method in which alkoxide having a thiol group or the like is formed on the surface of CdSe/ZnS nanoparticles, and silica glass fine particles containing one nanoparticle per one silica glass fine particle are prepared (Non-Patent Literature 2) has been reported. The PL efficiency in this case is reported to be 5 to 18%. There is a report on a silica glass fine particle prepared by a similar method, wherein the particle has a particle size of 30 nm to 1 nm and contains one CdSe/ZnS nanoparticle; however, this report is silent about the PL efficiency (Non-Patent Literature 3).

Meijerink et al. introduced CdSe/CdS/Cd$_{0.5}$Zn$_{0.5}$S/ZnS (CdSe as the core is sequentially coated with CdS, Cd$_{0.5}$Zn$_{0.5}$S, and ZnS) nanoparticles into silica glass fine particles by a reverse micelle method in order to introduce one nanoparticle into one silica glass fine particle. However, based on the examination of the mechanism, it was found that because hydrolyzed alkoxide has a high affinity for nanoparticles, the ligands arranged on the nanoparticle surface at the time of preparation are replaced by the hydrolyzed alkoxide, thus quenching the emission. Accordingly, in regard to the silica glass fine particle containing only one nanoparticle, the PL efficiency of the nanoparticle was rapidly decreased immediately after preparation, and was further gradually decreased. One week after preparation, the PL efficiency was about 2% of what it was before being introduced into the silica glass (a drop from the initial value of 60% to 1.2% in the absolute value). In order to suppress such quenching effect of silica glass, a nanoparticle with a specially made thick shell was used. As a result, the PL efficiency was increased to a maximum of 35% (Non-Patent Literature 4). However, such a nanoparticle with a specially made thick shell has a large particle size, and is not suitable for application in the field of biotechnology; additionally, it is difficult to prepare such nanoparticles.

There is known research in which a water-dispersible CdSe nanoparticle (citric acid coating) was prepared, and several of these nanoparticles were introduced into silica glass fine particles. However, the PL efficiency of water-dispersible CdSe nanoparticles is 0.1 to 0.15%, which is extremely low (Non-Patent Literature 5). The PL efficiency of the nanoparticle when it is introduced into a silica matrix is nowhere described; however, the PL efficiency is usually further decreased in that case. Therefore, such a product cannot be called a "fluorescent material (phosphor)." Further, in the case of relatively recent literature (Non-Patent Literature 6) in which a water-dispersible CdSe nanoparticle was similarly introduced into a silica particle by a reverse micelle method, the PL efficiency was 1.48% at most, and this nanoparticle cannot be called a "fluorescent material (phosphor)." As illustrated in Patent Literature 6, as a rough standard, the PL efficiency should be 20% or higher for a nanoparticle to be called a fluorescent material (phosphor).

As described above, a method for preparing fluorescent silica fine particles having a particle size of 20 to 100 nm, in which 10 or more nanoparticles containing Cd and Se are dispersed, has not been developed.

Meanwhile, recently, there is a report on a method for preparing an assembly of multiple nanoparticles using a linear polymer (Non-Patent Literature 7). Polymer particles prepared by this method are reported to have an average particle size of 112 nm, as measured by dynamic light scattering. At present, it is difficult to prepare nanoparticles having a particle size of 100 nm or less. It is possible to glass-coat the surface of the assembly; however, this further increases the particle size. Further, a glass material not containing a polymer generally has better durability, and produces a smaller amount of dissolved Cd released from particles. Therefore, there is a demand to prepare a glass material in which numerous semiconductor nanoparticles are dispersed, without using a polymer.

CITATION LIST

Patent Literature

PTL 1: Japanese Patent No. 4366502
PTL 2: Japanese Patent No. 3677538
PTL 3: Japanese Patent No. 3755033
PTL 4: Japanese Domestic Re-Publication of PCT International Application No. 2007/034877
PTL 5: Japanese Unexamined Patent Publication No. 2006-282977
PTL 6: Japanese Patent No. 4555966

Non-Patent Literature

NPL 1: Chan, Zimmer, Stroh, Steckel, Jain, and Bawendi, Advanced Materials, Vol. 16, p. 2092 (2004)
NPL 2: Gerion, Pinaud, Williams, Parak, Zanchet, Weiss, and Alivisatos, Journal of Physical Chemistry B, Vol. 105, p. 8861 (2001)
NPL 3: Nann and Mulvaney, Angewandte Chemie International Edition, Vol. 43, p. 5393 (2004)
NPL 4: Koole, Schooneveld, Hilhorst, Donega, Hart, Blaaderen, Vanmaekelbergh, and Meijerink, Chemistry of Materials, Vol. 20, p. 2503 (2008)
NPL 5: Rogach, Nagesha, Ostrander, Giersig, and Kotov, Chemistry of Materials, Vol. 12, p. 2676 (2000)
NPL 6: Chu, Sun, and Xu, Journal of Nanoparticle Research, Vol. 10, p. 613 (2008)
NPL 7: Yang, Dave, and Gao, Journal of American Chemical Society, Vol. 130, p. 5286 (2008)

SUMMARY OF INVENTION

Technical Problem

An object of the present invention is to provide silica glass fluorescent fine particles having high durability and an average particle size of 20 to 100 nm, in which numerous nanoparticles having high PL efficiency are dispersed. Further, another object of the present invention is to show means to apply the silica glass fluorescent fine particles in the field of biotechnology.

Solution to Problem

In order to solve the above-described problems, first, the present inventors examined the stability of nanoparticles dispersed at a low concentration in a buffer solution. As a result, it was found that nanoparticles containing Cd and Se are most excellent, and the present inventors thus decided to use such nanoparticles. It is even more excellent when the nanoparticle has a shell of ZnS, ZnSe, CdS, and the like on the surface. The shell may have a gradient composition in which the compositions of Cd, Zn, Se, S, and the like vary in the direction of the shell thickness. Further, in regard to silica glass fine particles for dispersing nanoparticles, it was found that the Stöber method, rather than a reverse micelle method, is suitable to obtain a uniform particle size in the desired particle size range (20 to 100 nm); and a synthesis method comprising the following three steps was developed. Steps (A), (B), and (C) described below respectively correspond to steps (A), (B), and (C) recited in the claim. Metal that contains silicon is preferably used as metal to be contained in a metal alkoxide (1) and a metal alkoxide (2) (described later), in terms of controlling the hydrolysis rate.

Step 1 (Step (A) in the Claim)

An adequate amount of the metal alkoxide (1) is added to lipophilic semiconductor nanoparticles containing Cd and Se and appropriately hydrolyzed, thereby replacing the ligands on the nanoparticle surface by a hydrolysate of the metal alkoxide (1). The thus-obtained solution is regarded as organic solution A. In this step, the nanoparticle surface is coated with the metal alkoxide (1) like a surfactant, thereby suppressing a decrease in the PL efficiency.

Step 2 (Step (B) in the Claim)

The metal alkoxide (2) is dispersed in an aqueous solution to cause partial hydrolysis, thereby obtaining aqueous solution B. As the metal alkoxide (2), a metal alkoxide whose hydrolysis rate is lower than that of the metal alkoxide (1) is selected. The aqueous solution B is mixed with organic solution A, thereby further forming a layer of the metal alkoxide (2) on the surface of semiconductor nanoparticles coated with the metal alkoxide (1). When the semiconductor nanoparticles are in contact with water, the metal alkoxide on the surface is further hydrolyzed, becomes hydrophobic, and moves to the aqueous phase. At this time, the nanoparticles form an assembly. Because the metal alkoxide (2) present around and on the surface has a lower hydrolysis rate compared to the metal alkoxide (1) used in step 1, the metal alkoxide (2) plays a role in preventing formation of large lumps of alkoxide caused by sudden dehydration-condensation and aggregation when alkoxide moves to the aqueous phase. Accordingly, there is a tendency that small assemblies are formed when the amount of metal alkoxide (2) is large and large assemblies are formed when the amount is small. Adding alcohol to the aqueous solution B used herein increases the contact area with the organic solution A, thereby reducing the reaction time. Examples of alcohols include methanol, ethanol, isopropanol, and the like.

Step 3 (Step (C) in the Claim)

A silica glass layer is further deposited on the assemblies in the aqueous phase, thereby preparing silica fine particles in which semiconductor nanoparticles are dispersed. This is performed by a regular Stöber method in which a slight amount of metal alkoxide (3) is hydrolyzed by a large amount of water and alcohol in the alkaline region, and deposited on each nanoparticle assembly that serves as the core. The thus-obtained fine particles are separated and washed, if necessary. The metal alkoxide (3) may be the same as the metal alkoxide (1) or (2).

It is also possible to modify the above-described preparation method so as to simultaneously add the metal alkoxide (1) and the metal alkoxide (2) whose hydrolysis rate is lower than that of the metal alkoxide (1) in step 1, thereby obtaining the organic solution A (step (A1) in the claim). At this time, in step 2, the metal alkoxide (3) and an alkaline aqueous solution are added to render the nanoparticle surface in the organic solution A hydrophilic so as to transfer the nanoparticles to the aqueous phase, and assemblies are formed at the same time (step (B1) in the claim). In this case, the nanoparticle surface is coated with two types of metal alkoxides (1) and (2). Because of its effect, there was a case where assemblies in which the nanoparticles are regularly arranged were obtained. It is possible to further protect the surface of the nanoparticle assemblies with a silica glass layer by applying the above-described step 3 after step 2.

This preparation method is generally described as follows.

First, the metal alkoxides A and B are added to a non-polar solvent in which lipophilic semiconductor nanoparticles are dispersed; and the mixture is stirred, thereby obtaining organic solution X. Herein, it is possible to control the mutual distance between each assembly during formation of assemblies in the next stage and the PL efficiency by simultaneously adding the metal alkoxide A and the metal alkoxide B whose hydrolysis rate is lower than that of the metal alkoxide A. Examples of non-polar solvents include toluene, hexane, benzene, diethyl ether, chloroform, ethyl acetate, methylene chloride, and the like (step (A2) in the claim). In this step, the surface of lipophilic semiconductor nanoparticles is replaced by partially hydrolyzed metal alkoxides A and B. Next, this organic solution X is brought into contact with solution Y containing the metal alkoxide A or B and water, thereby transferring the semiconductor nanoparticles in the organic solution X to the solution Y (step (B2) in the claim). In this step, the phase transfer is performed using characteristics that the alkoxides A and B that are bound to the surface of the semiconductor nanoparticles in the organic solution X are further hydrolyzed and become hydrophilic by contact with the water. Once in the water, hydrolysis or dehydration-condensation of the alkoxide further progresses, resulting in the formation of assemblies of the semiconductor nanoparticles. Subsequently, the surface of the assembly may be coated with silica glass or modified with a functional group, if necessary.

The present inventors confirmed that fluorescent silica glass fine particles in which semiconductor nanoparticles containing Cd and Se are dispersed, which are prepared by the sol-gel method modified as described above, achieve an average particle size of 20 to 100 nm, and form assemblies in which nanoparticles are densely packed while substantially maintaining the PL efficiency obtained in the organic solution; and that even when the concentration is diluted to about 10 nM in a buffer solution for biotechnology, a decrease in the PL efficiency and degradation such as dissolution of cadmium ions are less likely to occur because of the silica network structure. The present invention was completed based on the above findings.

Specifically, the present invention provides highly durable fine particles in which semiconductor nanoparticles with high brightness are dispersed, and a method for preparing the fine particles by a sol-gel method, as described below. In the present invention, the PL efficiency of prepared fluorescent fine particles is close to 30% by the use of nanoparticles whose PL efficiency in an organic solution is 30%. It is possible to obtain fluorescent fine particles whose PL efficiency is close to 70% by the use of nanoparticles whose PL efficiency in an organic solution is 70%.

Item 1. Fluorescent fine particles comprising Cd- and Se-containing semiconductor nanoparticles dispersed in silicon-containing fine particles, wherein the average particle size of the silicon-containing fine particles is 20 to 100 nm, and the number of semiconductor nanoparticles dispersed in each silicon-containing fine particles is 10 or more.

Item 2. The fluorescent fine particles according to Item 1, wherein the average particle size of the silicon-containing fine particles is 40 to 100 nm, and the number of semiconductor nanoparticles dispersed in each silicon-containing fine particles is 20 or more.

Item 3. The fluorescent fine particles according to Item 1 or 2, wherein the semiconductor nanoparticles dispersed in each silicon-containing fine particles are regularly arranged.

Item 4. The fluorescent fine particles according to any one of Items 1 to 3, wherein the PL efficiency is 20% or higher.

Item 5. The fluorescent fine particles according to any one of Items 1 to 4, wherein the PL efficiency is 20% or higher when the semiconductor nanoparticles are dispersed at a concentration of 10 nmol/L in a pH 7.4 solution of HEPES (2-[4-(2-hydroxyethyl)-1-piperazinyl]ethanesulfonic acid) serving as a Good's buffer.

Item 6. The fluorescent fine particles according to any one of Items 1 to 5, wherein after the semiconductor nanoparticles are dispersed in a pH 7.4 solution (HEPES concentration of 10 mmol/L) of HEPES (2-[4-(2-hydroxyethyl)-1-piperazinyl]ethanesulfonic acid) serving as a Good's buffer, at a concentration of X nmol/L, and left to stand at room temperature for 15 hours, Y nanograms that indicate the dissolved amount of Cd in the HEPES solution (the weight of dissolved Cd in a solution of 1 mL) satisfies $10 \times Y/X < 1$.

Item 7. The fluorescent fine particles according to any one of Items 1 to 6, wherein the semiconductor nanoparticles are CdSe and/or CdSe/ZnS in which CdSe is coated with ZnS.

Item 8. The fluorescent fine particles according to any one of Items 1 to 7, having a silicon-containing layer which has a thickness of 2 nm or more.

Item 9. The fluorescent fine particles according to any one of Items 1 to 8, comprising on the surface at least one selected from the group consisting of COOH, $NH_2$, SH, salts thereof, and groups originated from polyethyleneglycol.

Item 10. The fluorescent fine particles according to any one of Items 1 to 9 for fluorescent probes.

Item 11. The fluorescent fine particles according to any one of Items 1 to 9 for electronic materials.

Item 12. The fluorescent fine particles according to any one of Items 1 to 11, wherein the fluorescent fine particles exhibit electroluminescence and/or cathodeluminescence.

Item 13. A method of preparing the fluorescent fine particles according to any one of Items 1 to 12, comprising the steps of:

(A) adding a metal alkoxide (1) to an organic solvent in which Cd- and Se-containing lipophilic semiconductor nanoparticles are dispersed, and stirring the mixture, thereby obtaining organic solution A;

(B) mixing aqueous solution B containing a metal alkoxide (2) whose hydrolysis rate is lower than that of the metal alkoxide (1) with the organic solution A and stirring the mixture, thereby obtaining an semiconductor nanoparticle assembly; and (C) adding a solution containing a metal alkoxide (3) to an alkaline aqueous solution containing the semiconductor nanoparticle assembly, thereby forming a coating layer on the surface of the semiconductor nanoparticle assembly.

Item 14. The method of preparing fluorescent fine particles according to Item 13, wherein the metal alkoxide (2) is a compound represented by Formula (II):

$$X_n-Si(OR^2)_{4-n} \qquad (II)$$

wherein X represents a group represented by $CH_2=CH-$, a group containing oxirane, a group represented by $H_2NC_mH_{2m}-$, a group represented by $CH_2=C(CH_3)COOC_pH_{2p}-$, a group represented by $HSC_qH_{2q}-$, or a phenyl group; $R^2$ represents a lower alkyl group; n is an integer of 1, 2, or 3; m is an integer of 1 to 6; p is an integer of 1 to 5; and q is an integer of 1 to 10.

Item 15. The method of preparing fluorescent fine particles according to Item 13 or 14, wherein heating is performed during Step (C).

Item 16. A method of preparing the fluorescent fine particles according to any one of Items 1 to 12, comprising the steps of:

(A1) adding a metal alkoxide (1) and a metal alkoxide (2) whose hydrolysis rate is lower than that of the metal alkoxide (1) to an organic solvent in which Cd- and Se-containing lipophilic semiconductor nanoparticles are dispersed, and stirring the mixture, thereby obtaining organic solution A; and (B1) adding a metal alkoxide (3) and an alkaline aqueous solution to the organic solution A, thereby forming a semiconductor nanoparticle assembly.

Item 17. A method of preparing the fluorescent fine particles according to any one of Items 1 to 12, comprising the steps of:

(A2) adding two types of metal alkoxides to a non-polar solvent in which Cd- and Se-containing lipophilic semiconductor nanoparticles are dispersed, and stirring the mixture, thereby obtaining organic solution X; and (B2) bringing the organic solution X into contact with solution Y containing a metal alkoxide and water so as to transfer the semiconductor nanoparticles in the organic solution X to the solution Y.

Advantageous Effects of Invention

The fluorescent fine particles of the present invention contain a dispersion of a considerable amount of semiconductor nanoparticles having durability and high PL efficiency, and the surface of thereof is coated with appropriately hydrolyzed alkoxide. These semiconductor nanoparticles form an assembly of an appropriate size, and the circumference of the assembly is coated with silica glass. Therefore, the present invention achieves the effect of providing two characteristics, i.e., high durability and high brightness. Further, because the average particle size is 20 to 100 nm, the fluorescent fine particles are applicable as fluorescent probes in the field of biotechnology. The semiconductor nanoparticle assembly being coated with silica glass can be confirmed by analysis of the coated portion using an analytical electron microscope because the results show that silicon and oxygen are contained. It can also be confirmed from the fact that powder X-ray diffraction (irradiation with copper Kα ray, at 1.5406 angstrom) of vacuum-dried powder sample shows a broad diffraction peak (a full width at half-maximum of 5 degrees or more) near an angle (2θ) of 23 degrees.

DESCRIPTION OF EMBODIMENTS

Figure 1A:
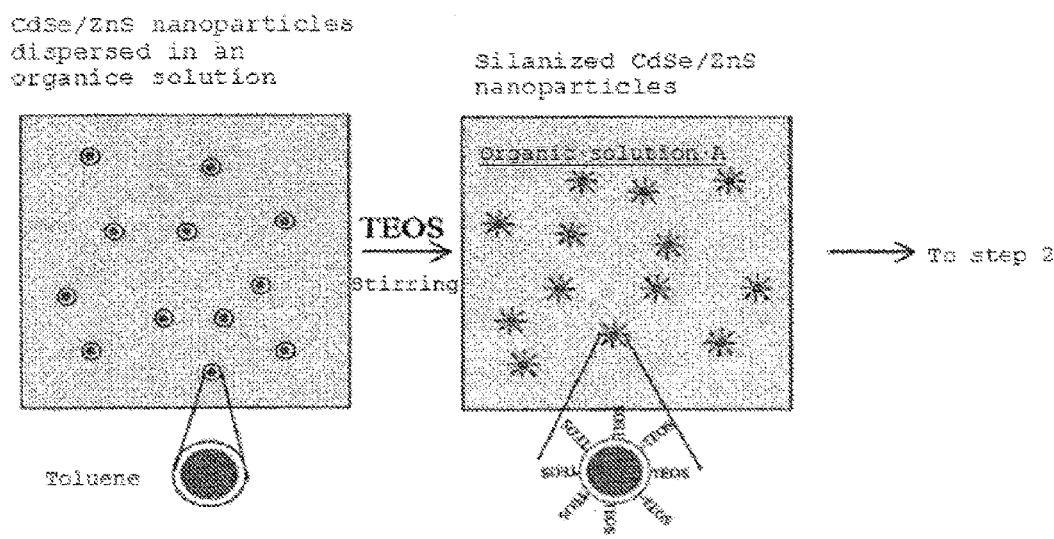
FIG. 1A A schematic diagram showing step 1 in the preparation process of the fluorescent fine particles prepared in Example 1.

Hereinafter, the present invention is described in the order of preparation of fluorescent fine particles, application, and evaluation.

I. Preparation of Fluorescent Fine Particles

The present invention prepares fluorescent fine particles in which 10 or more Cd- and Se-containing fluorescent semiconductor nanoparticles are dispersed in a matrix containing silicon having an average particle size of 20 to 100 nm. The preparation process comprises four steps: 1. preparation of semiconductor nanoparticles, 2. coating of the nanoparticles, 3. formation of a nanoparticle assembly, and 4. preparation of a fluorescent fine particle by coating the assembly with glass. Further, if necessary, another step, 5. modification of the surface of the fluorescent fine particle, may be performed. When preparing fluorescent fine particles as electronic materials, the preparation process may be ended at the second, third, or fourth step. For the application where electrons are passed through the nanoparticles in electronic materials, a glass layer on the surface or a functional group on the surface on the glass layer may be unnecessary. These steps are described below in order.

First Step: Preparation of Semiconductor Nanoparticles

Examples of semiconductor nanoparticles used in the present invention include those containing Cd and Se, specifically, CdSe, CdSe/ZnS (CdSe nanoparticle coated with ZnS), CdSe/CdS/Cd$_{0.5}$Zn$_{0.5}$S/ZnS (nanoparticle obtained by sequentially coating CdSe as the core with CdS, Cd$_{0.5}$Zn$_{0.5}$S, and ZnS), and CdSe$_x$Te$_{1-x}$ (0<x<1) having an alloy composition. These semiconductor nanoparticles are prepared by the following ten known, typical methods.

Dmitri V. Talapin, Andrey L. Rogach, Ivo Mekis, Stephan Haubold, Andreas Kornowski, Markus Haase, Horst Weller, Colloids and Surfaces A, 202, 145 (2002).
Dmitri V. Talapin, Andrey L. Rogach, Andreas Kornowski, Markus Haase, and Horst Weller, NANO LETTERS, 1, 207 (2001)
Z. Adam Peng and Xiaogang Peng, J. Am. Chem. Soc., 123, 1389 (2001).
C. B. Murray, D. J. Norris, M. G. Bawendi, J. Am. Chem. Soc., 115, 8706(1993).
B. O. Dabbousi, J. Rodriguez-Viejo, F. V. Mikulec, J. R. Heine, H. Mattoussi, R. Ober, K. F. Jensen, and M. G. Bawendi, J. Phys. Chem. B, 101 (46), 9463(1997).
Lianhua Qu and Xiaogang Peng, J. Am. Chem. Soc., 124, 2049 (2002).
Xinhua Zhong, Yaoyu Feng, and Yuliang Zhang, J. Phys. Chem. C, 111, 526 (2007).
Renguo Xie, Ute Kolb, Jixue Li, Thomas Basche, and Alf Mews, J. Am. Chem. Soc., 127, 7480 (2005).
Robert E. Bailey and Shuming Nie, J. Am. Chem. Soc., 125, 7100 (2003).
S. Jun, E. Jang, J. E. Lim, Nanotechnology, 17, 3892 (2006).

The average particle size of semiconductor nanoparticles prepared by these methods is about 2 to 9 nm.

All of the methods use a high-temperature reaction in an organic solution from which water is removed. The ligands on the nanoparticle surface prepared in the first step are replaced by the metal alkoxide (1) hydrolyzed in the second step (step 1) described below. Therefore, ligands with low binding energy are preferable in this step. Examples of specific ligands include phosphate compounds having an alkyl group (trioctylphosphine, trioctylphosphine oxide, and the like), alkylamine, oleic acid, and the like.

Second Step: Coating of Nanoparticles (Step 1 (Step (A) in the Claim))

In the second step, by a sol-gel method using the hydrolyzed metal alkoxide (1), the surface of the semiconductor nanoparticles prepared in the first step is coated with the hydrolyzed metal alkoxide (1).

To coat the semiconductor nanoparticles with silica glass while maintaining the PL efficiency of semiconductor nanoparticles has been an interest of the academic community in recent years. Therefore, there was a continuing debate regarding whether the original ligands on the surface are removed when hydrophobic nanoparticles are coated with silica glass. Later, known Non-Patent Literature (Chemistry of Materials, Vol. 20, p. 2503 (2008)) demonstrated that hydrolyzed alkoxide has a high affinity for nanoparticles, and coats the nanoparticles by replacing ligands such as alkylamine bound to the surface at the time of preparation. However, it has been reported that while the alkylamine ligands improve the PL efficiency by eliminating surface defects, a ligand ((Et-O)$_3$—Si—O$^-$) comprising a partially hydrolyzed alkoxide has a quenching effect, which causes a rapid decrease in the PL efficiency. At the same time, it has been unknown why hydrolyzed alkoxide has a quenching effect.

On the other hand, it is considered necessary that the ligands closely cover the nanoparticle surface in order to maintain the PL efficiency. For this, unbranched primary alkylamines are effective, as described in Non-Patent Literature (Colloids and Surfaces A, Vol. 202, p. 145 (2002)).

As a result of a search for coating conditions based on these literature, the present inventors found that there is hardly any decrease in the PL efficiency of nanoparticles even after the surface is replaced by alkoxide hydrolysates, as long as the hydrolysis rate of alkoxide is reduced, the concentration of semiconductor nanoparticles is diluted low, and the reaction time is extended. Specifically, it became clear that hydrolyzed alkoxide itself does not have a quenching effect, but quenching results from random aggregation of alkoxides on the nanoparticle surface, an insufficient number of alkoxide bound to the surface, and the like. The present inventors revealed such a mechanism, and found a method for coating the surface of nanoparticles with hydrolysis products of alkoxide without quenching the nanoparticles.

Specifically, first, the hydrophobic nanoparticles prepared in the above-described first step, covered with an alkyl group-containing phosphate compound, alkylamine, oleic acid, and the like are provided. At least three types of the following alkoxides are provided: the metal alkoxide (1) used in the second step, the metal alkoxide (2) used in the subsequent third step, and the metal alkoxide (3) further used in the fourth step. In regard to these metal alkoxides, it is advantageous that silicon is used as at least one type of metal to facilitate control of hydrolysis. Further, the metal alkoxides (1) and (2) are selected in such a manner that the hydrolysis rate of the metal alkoxide (1) in the alkaline solution is higher than that of the metal alkoxide (2). If necessary, another metal alkoxide may further be added to improve controllability of hydrolysis rate, fine particle size and form, and the like.

The metal alkoxide (1) used in this step is not particularly limited; however, a metal alkoxide with a high hydrolysis rate is preferable because the metal alkoxide (1) must have a higher hydrolysis rate than the metal alkoxide (2) as described above.

Specific examples include a metal alkoxide represented by Formula (I):

$$Si(OR^1)_4 \qquad (I)$$

wherein $R^1$ represents a lower alkyl group.

In this step, for example, the synthesis can be performed by the following procedure.

2 to 400 μL (more preferably 5 to 80 μL, and most preferably 10 to 30 μL) of the metal alkoxide (1) is added to a non-polar solvent (about 2.5 mL) such as toluene in which the nanoparticles are dispersed, thereby obtaining organic solution A. When tetraethoxysilane (tetraethyl orthosilicate) (TEOS) is selected as the metal alkoxide (1), this solution is stirred for 1 to 8 hours (more preferably 2 to 5 hours, and most preferably 2.5 to 3.5 hours), and organic solution A can thereby be obtained.

When the stirring time is shorter than the above range, there is a tendency for transfer to the aqueous phase to not be easily carried out in the subsequent third step because the amount of hydrolyzed metal alkoxides (1) bound to the nanoparticle surface is small. Further, when the stirring time is longer than the above range, there is a tendency for the PL efficiency to decrease and agglomeration to occur because too many hydrolyzed metal alkoxides (1) are bound to the nanoparticle surface.

The hydrolysis rate increases when, for example, tetramethoxysilane (tetramethyl orthosilicate) (TMOS) is selected instead of TEOS. Therefore, the stirring time can be shortened if other hydrolysis conditions are the same. Specifically, the stirring time (hydrolysis time) is preferably set to, for example, about 30 minutes to about 4 hours. When silicon alkoxide is used, a silica glass layer containing transparent silicon is formed. In the case of TEOS, because it is better to decrease the hydrolysis rate, it is effective to perform hydrolysis only using moisture drawn from the air. A glovebox with adjusted atmosphere can also be used to perform hydrolysis in a more controlled manner. As described above, the stirring time and the like may be adjusted according to the hydrolysis rate of the metal alkoxide (1) used.

Third Step: Formation of Nanoparticle Assembly (Step 2 (Step (B) in the Claim))

In this step, first, an appropriate amount of an appropriate type of metal alkoxide (2) is added to the aqueous phase to cause hydrolysis, thereby obtaining aqueous solution B. The reaction at this time preferably occurs in the alkaline region. For this reason, ammonia, sodium hydroxide, or the like is added, with ammonia being particularly preferable. Further, the aqueous solution B and the organic solution A are mixed together, and assemblies of the nanoparticles are formed while the nanoparticles are transferred to the aqueous phase.

As described above, the metal alkoxide (2) in this step preferably has a lower hydrolysis rate than the metal alkoxide (1) in the second step. Specific examples include those represented by Formula (II):

$$X_n\text{—}Si(OR^2)_{4-n} \quad (II)$$

wherein X represents a group represented by $CH_2$=CH—, a group containing oxirane, a group represented by $H_2NC_mH_2$—, a group represented by $CH_2$=$C(CH_3)$ $COOC_pH_{2p}$—, a group represented by $HSC_qH_{2q}$—, or a phenyl group; $R^2$ represents a lower alkyl group; n is an integer of 1, 2, or 3; m is an integer of 1 to 6; p is an integer of 1 to 5; and q is an integer of 1 to 10.

In this step, for example, the synthesis can be performed by the following procedure.

The metal alkoxide (2) (0.2 to 5 µL, more preferably 0.5 to 2 µL, and most preferably 0.7 to 1.5 µL) is mixed with an organic solvent such as ethanol or the like (10 to 50 mL, more preferably 15 to 30 mL, most preferably 20 to 27 mL) and alkaline aqueous solution such as aqueous ammonia or the like (1 to 8 mL, more preferably 2 to 6 mL, and most preferably 3 to 5 mL; the concentration is about 3 wt %). The aqueous solution B can be obtained using 3-mercaptopropyl trimethoxysilane (MPS) or the like as the metal alkoxide (2). The hydrolysis rate of the metal alkoxide (2) such as MPS as a typical example is lower than TEOS or the like used as the metal alkoxide (1). The molar concentration of the metal alkoxide (2) is preferably $1.9 \times 10^{-5}$ to $4.7 \times 10^{-4}$ mol/L, more preferably $4.7 \times 10^{-5}$ to $1.9 \times 10^{-4}$ mol/L, and most preferably $6.6 \times 10^{-5}$ to $1.4 \times 10^{-4}$ mol/L.

When the organic solution A and the aqueous solution B are mixed together and stirred for 1 to 8 hours (more preferably 2 to 6 hours, and most preferably 2.5 to 3.5 hours), the hydrolysis of alkoxides on the surface proceeds. Consequently, the semiconductor nanoparticles are transferred to the aqueous phase; and further, assemblies of the nanoparticles are formed in the aqueous phase.

In these second and third steps, when the amount of the organic solvent (toluene) described at the beginning of the second step is changed from 1 mL, the amount of each solution may be changed in a proportional manner.

Herein, if TEOS or the like used as the metal alkoxide (1) is used as the metal alkoxide (2), the size of the assemblies will rapidly increase in the aqueous phase, causing white turbidity. This shows that the metal alkoxide (2) has an effect of adjusting the size of the assemblies.

In this step, the alkoxides on the surface of the hydrophobic nanoparticles prepared in the first and second steps are further hydrolyzed, and the nanoparticles are thereby gradually rendered hydrophilic and converted to the aqueous phase. When the nanoparticles are converted to the aqueous phase, the hydrolysis reaction proceeds rapidly and randomly, resulting in a large assembly and white turbidity of the solution, if no countermeasure is taken. Such a phenomenon is observed when a metal alkoxide with a high hydrolysis rate, such as TEOS, is used as the metal alkoxide (2). However, when an alkoxide with a low hydrolysis rate is added to the aqueous phase, the alkoxide is bound to the surface of the nanoparticles that are transferred to the aqueous phase, allowing gradual aggregation of the nanoparticles. This causes a decrease in the particle size distribution of the assemblies and the distribution of the number of incorporated nanoparticles. Accordingly, a decrease in the amount of the metal alkoxide (2) added to the aqueous phase causes an increase in the size of the assemblies and in the number of incorporated nanoparticles. The present inventors revealed such a mechanism, and found a method for controlling the number of nanoparticles to be dispersed and the whole particle size, and forming an assembly in which silica glass acts as the glue in the aqueous phase.

Fourth Step: Preparation of Fluorescent Fine Particles by Coating the Assemblies with Glass (Step 3 (Step (C) in the Claim))

In this step, the metal alkoxide (3) is hydrolyzed in an alkaline aqueous solution containing alcohol by the so-called Stöber method, and the nanoparticle assemblies prepared in the third step are used as seeds to deposit silica glass components on the surface of the cores, thereby forming silica glass coating. Ammonia, sodium hydroxide, or the like is used for alkalification, with ammonia being particularly preferable. Examples of alcohols include lower (the carbon number is 5 or less) primary alcohols, with ethanol, methanol, and the like being preferable. Preferable examples of the metal alkoxide (3) are tetrafunctional metal alkoxydes, with TEOS being particularly preferable.

In this step, the solution obtained in the third step is centrifuged, if necessary, to remove large particles. Further, water is removed to concentrate the solution to render the concentration of the semiconductor nanoparticles about 0.1 to about 5 µM (more preferably 0.3 to 3 µM, and most preferably 0.5 to 2 µM). The thus-obtained aqueous solution (about 0.5 mL) is extracted, and a lower alcohol (2 to 20 mL, more preferably 4 to 10 mL, and most preferably 7 to 9 mL) and an alkaline aqueous solution (0.01 to 0.2 mL, more preferably 0.05 to 0.15 mL, and most preferably 0.07 to 0.12 mL; the concentration is about 25 wt %) are added to the solution. Further, the metal alkoxide (3) (5 to 40 µL, more preferably 7 to 20 µL, and most preferably 10 to 16 µL) is added dropwise thereto. In this way, a silica glass layer is formed on the surface of the semiconductor nanoparticle assemblies, and silica glass fine particles are obtained. Further, after stirring for 0.5 to 5 hours, more preferably 1 to 4 hours, and most preferably 1.5 to 3 hours, the mixture is centrifuged to extract the fluorescent fine particles. Subsequently, the fluorescent fine particles may be dispersed in pure water at a concentration of about 1 µM. In this step, when the amount of initially used aqueous solution is changed from 0.5 mL, the amount of each solution may be changed in a proportional manner.

In order to prevent dissolution of constituents of the nanoparticles, in particular, dissolution of Cd, from the fluorescent fine particles, the thickness of the silica glass layer (shell) prepared in this step is preferably 2 nm or more, and most preferably 4 nm or more. When the average particle size of the fluorescent fine particles becomes greater than 20 nm and reaches about 50 nm, the thickness of the silica glass layer can be 10 nm or more. Further, when the average particle size of the fluorescent fine particles is close to 100 nm, the thickness of the silica glass layer can be 20 nm or more. The thickness of the layer of silica glass can be easily determined by measuring an outer portion in which semiconductor nanoparticles are not contained by transmission electron microscope observation. When the thickness varies depending on the position along the circumference, the average thickness determined from the entire circumference is defined as the thickness of the silica glass layer.

Further, by performing heating in this step, it is possible to develop the silica glass network structure so as to more effectively prevent the dissolution of Cd. The heating temperature is about 30 to about 85° C., more preferably about 35 to about 60° C., and most preferably about 37 to about 50° C.

Fifth Step: Surface Modification of Fluorescent Fine Particles

Hydroxyl groups are present on the surface of the water-dispersible fluorescent fine particles prepared in the above-described fourth step, if left as-is. The surface can be modified with a carboxyl group by further adding an alkoxide containing a carboxyl group (for example, carboxyethylsilanetriol sodium salt or the like) to the fluorescent fine particles. The surface can also be modified with a thiol group by further adding an alkoxide containing a thiol group (for example, 3-mercaptopropyltrimethoxysilane (MPS) or the like) to the fluorescent fine particles. It is also possible to simultaneously coat the surface with silica and modify the surface by mixing the alkoxide used in this step with the metal alkoxide (3). Further, the surface can also be modified using an amino group (for example, 3-aminopropyltrimethoxysilane (APS) or the like) or a group originated from polyethyleneglycol (for example, 2-[methoxy(polyethylenoxy)propyl]-trimethoxysilane or the like).

II. Application of Fluorescent Fine Particles

The fluorescent fine particles of the present invention specifically bind to specific molecules in living organisms, using the surface modification, and can be used as fluorescent probes for observing the distribution, amount, behavior, and the like of the specific molecules. Further, because the fluorescent fine particles are high in brightness, PL efficiency, and durability, these particles can also be used as fluorescent materials with good energy efficiency for electronic materials. In addition to the above-described application in which a short-wavelength light is irradiated to cause excitation and emission, the fluorescent fine particles can also be used as fluorescent materials for electroluminescence (emission is caused by applying an alternating voltage or direct voltage), cathodeluminescence (applying a high-speed electron beam), and the like.

III. Evaluation of Fluorescent Fine Particles

1. Concentration of Dispersed Nanoparticle in the Solution

The concentration of the dispersed semiconductor nanoparticles containing Cd and Se of the present description can be determined by comparing the absorption spectrum of the nanoparticles in light of literature (for example, Chemistry of Materials, Vol. 15, p. 2854, 2003). When the composition is changed, the concentration can be determined by utilizing the additivity. Additionally, when the CdSe core is coated with ZnS as the shell, the concentration can be determined using literature (Journal of Physical Chemistry B, Vol. 101, p. 9463 (1997)).

2. PL Efficiency of the Nanoparticles

The PL efficiency described in the present description refers to the internal quantum efficiency, and is defined as the possibility of emission of fluorescence photons after the nanoparticles are excited by the light. In the case of a solution, this value is determined by comparing the absorbance and the emission intensity of the solution with those of a standard substance (0.1N sulfuric acid solution of quinine) whose PL efficiency is known. In order to determine the PL efficiency of a dilute solution having a nanoparticle concentration of about 10 nM, it is preferable to calibrate the sensitivity of absorption and fluorescence spectrophotometers at each wavelength, and confirm the stability of the baseline. Further, the temperature fluctuations in the laboratory where measurement devices are placed are preferably controlled to about ±2° C. Specifically, it is preferable to use the method described in literature (Journal of Luminescence, Vol. 128, p. 1896 (2008)) by the present inventors. Although the fluorescence of quinine is in the blue region, it is possible to determine the PL efficiency of fluorescence in the red region in the same manner as long as the sensitivity of the fluorescence spectrophotometer is calibrated at each wavelength. For higher accuracy, the value of the PL efficiency may be confirmed using a standard substance (for example, Rhodamine 6G) emitting in the red region.

The brightness of the silica glass fine particles is proportionate to (PL efficiency×the number of nanoparticles dispersed in one silica glass fine particle).

3. The Number of Semiconductor Nanoparticles Dispersed in One Silica Glass Fine Particle The number of semiconductor nanoparticles dispersed in each silica glass fine particle can be substantially accurately counted by transmission electron microscope observation at an accelerating voltage of 200 keV or more. However, when the size of the silica glass fine particle is near 100 nm, the accelerating voltage is preferably about 300 keV. Because the shape and size of each nanoparticle are substantially constant, even when some particles are overlapped in the moving direction of electrons of a transmission electron microscope, it is possible to discern the overlapping by a discontinuous change in the contour of the particles, as long as it is not a complete overlap. A higher accuracy can be achieved by taking images of the sample by sequentially changing the angle using an electron beam tomography method, and showing the images in 3D using dedicated software.

In any case, in order to determine the number of dispersed nanoparticles, at least about 30 silica glass fine particles in the field of vision are selected from among randomly selected observation samples. Then, the number of dispersed nanoparticles in the silica glass fine particles is counted, and a histogram is prepared. After confirming that the distribution is not disproportionate, the histogram is averaged.

As another method, it is possible to derive the number of dispersed nanoparticles by dissolving the silica glass fine particles with an acid, and determining the molar ratio of each component by chemical analysis. At this time, if the composition of the nanoparticles is also determined by chemical analysis, it is possible to obtain an accurate value. Even if it is not possible to obtain an accurate value, the rough composition of the nanoparticles can be determined from the particle size of nanoparticles, it is possible to estimate the number of dispersed nanoparticles.

4. Quantitative Determination of Dissolved Cadmium

As described in Background Art, because semiconductor nanoparticles have a large specific surface area, a defect on the surface significantly influences the emission properties. It is preferable when the amount of dissolved cadmium is small under conditions similar to those for the application of biotechnology (the nanoparticle concentration in a buffer solution is low, specifically, about 10 nM or less) in order to prevent cell death. In addition, because dissolution inevitably occurs from the surface of the semiconductor nanoparticles, when the dissolution amount is small, it leads to less occurrence of surface defects, and the prevention of a reduction in the PL efficiency. Therefore, quantitative determination of the dissolution amount is important to determine the degree of usefulness.

The most commonly used medium as a buffer solution or culture solution for the above assessment is DMEM (Dulbecco's Modified Eagle Medium). For the measurement, a solution obtained by dispersing the prepared silica glass fine particles or commercially available polymer-coated nanoparticles and allowing the dispersion to stand for a certain period of time is filtered through a filter, and the Cd concentration in the filtrate is measured by ICP mass spectrometry. However, when the dissolved Cd is quantified using the filtrate, the dissolution amount decreases with time. This is because the dissolved Cd forms assemblies with the components in DMEM, and the assemblies thereby grow to the same size of the semiconductor nanoparticles and are stopped by the filter, resulting in a decrease in the amount of Cd. This is also suggested from the fact that there is no correlation between the amount of Cd and the amount of Se that is simultaneously dissolved.

On the other hand, a HEPES solution is also a commonly used buffer solution, and is ideal because the degree of binding to metal has been reported to be undetectable. Therefore, a HEPES buffer solution is used for the assessment of dissolved cadmium. Further, the dissolution amount is converted to a dissolution amount at a dispersed semiconductor nanoparticle concentration of 10 nM for comparison.

EXAMPLES

The present invention is described in more detail below with reference to examples; however, the present invention is not limited to these examples.

Example 1

Synthesis of Silica Glass Fine Particles

CdSe/ZnS nanoparticles (CdSe core, ZnS shell) whose surface is coated with dodecylamine were prepared by a known method (Nano Letters, Vol. 1, p. 207 (2001) and Colloids and Surfaces A, Vol. 202, p. 145 (2002)). The nanoparticles were dispersed at a concentration of 20 μM in a toluene solution. The PL efficiency was measured to be 35%. The emission wavelength was about 620 nm, and the half-bandwidth (full width at half-maximum) of the emission spectrum was about 33 nm.

Figure 1B:
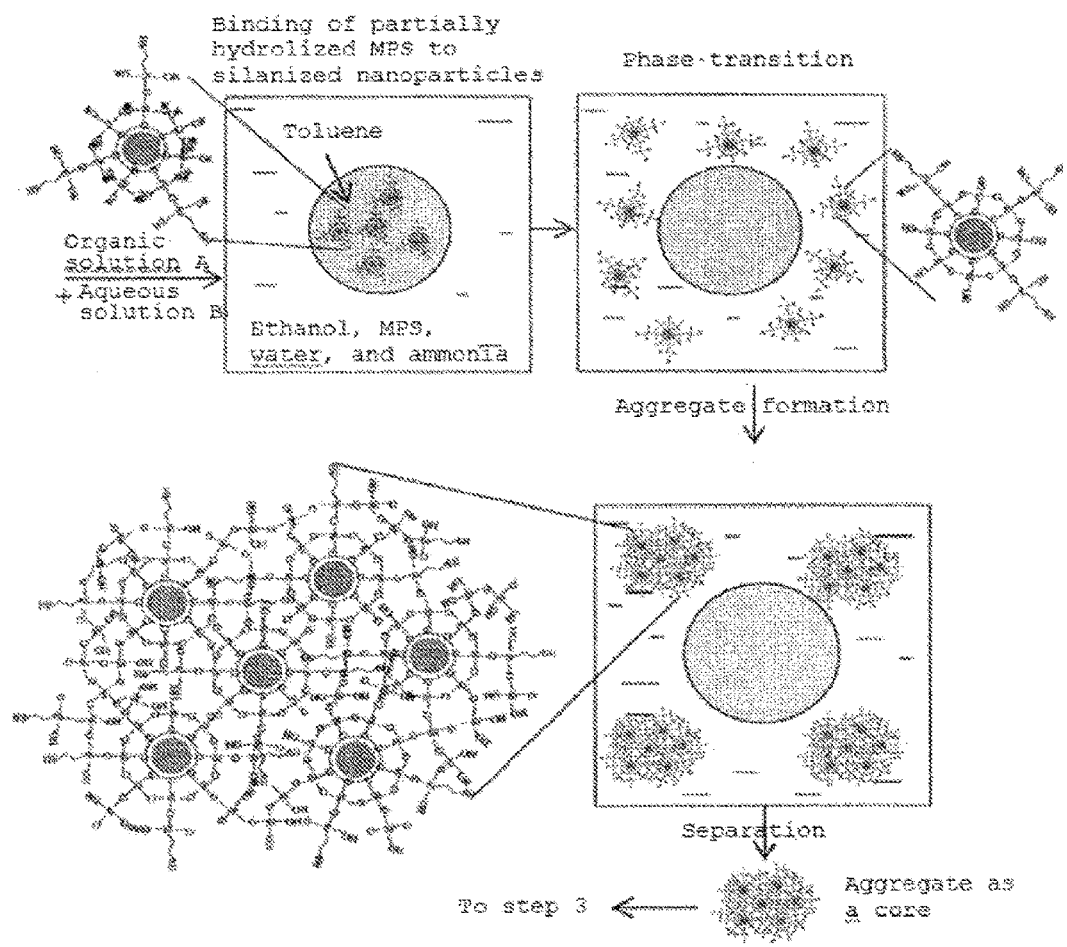
FIG. 1B A schematic diagram showing step 2 in the preparation process of the fluorescent fine particles prepared in Example 1.
Figure 1C:
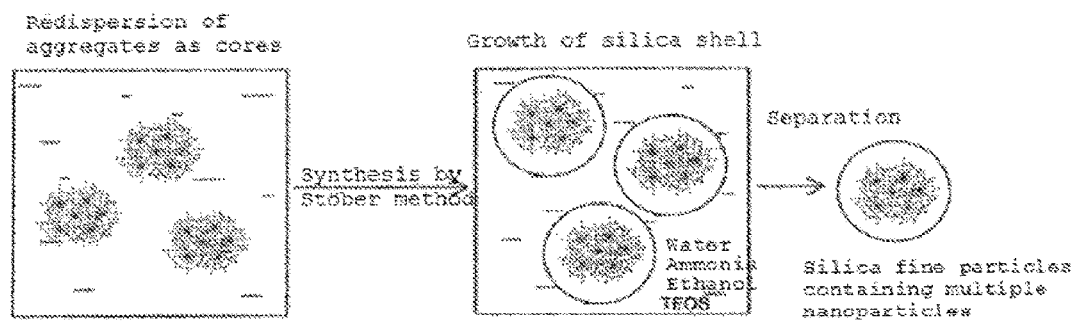
FIG. 1C A schematic diagram showing step 3 in the preparation process of the fluorescent fine particles prepared in Example 1.

Next, silica glass fine particles in which fluorescent nanoparticles are dispersed were prepared via 3 stages from step 1 to 3 shown in FIGS. 1A to 1C. Unless otherwise stated, the synthesis was carried out at room temperature in the atmosphere.

In step 1, tetraethoxysilane (TEOS, 10 μL) was added to a toluene solution in which nanoparticles are dispersed (0.4 mL, 1.5 μmol/L), and the mixture was stirred for 3 hours, thereby obtaining organic solution A. In regard to the nanoparticles in this solution, only one ethoxy group of the tetrafunctional TEOS is considered to be hydrolyzed and converted to $(Et-O)_3-Si-O^-$ (wherein Et is ethyl group), which then becomes a ligand and acts as a surfactant, orderly covering the surface of the nanoparticles. In this state, a decrease in the PL efficiency was hardly observed.

Figure 2:
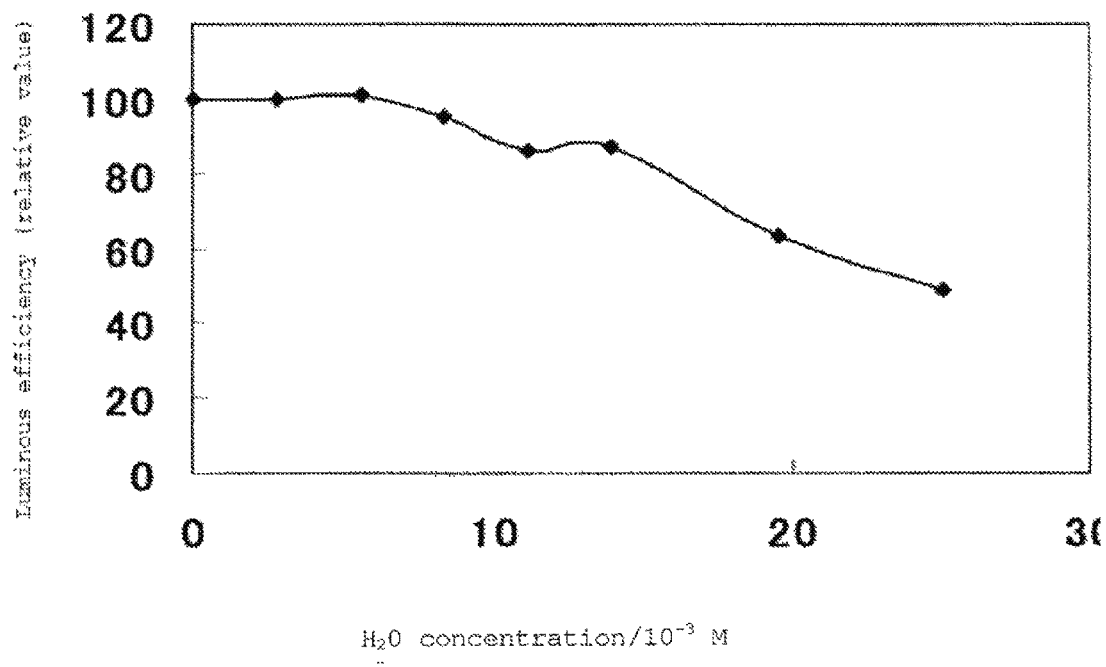
FIG. 2 A graph showing the concentration of water and the PL efficiency of the semiconductor nanoparticles in step 1 in Example 1.
Figure 3:
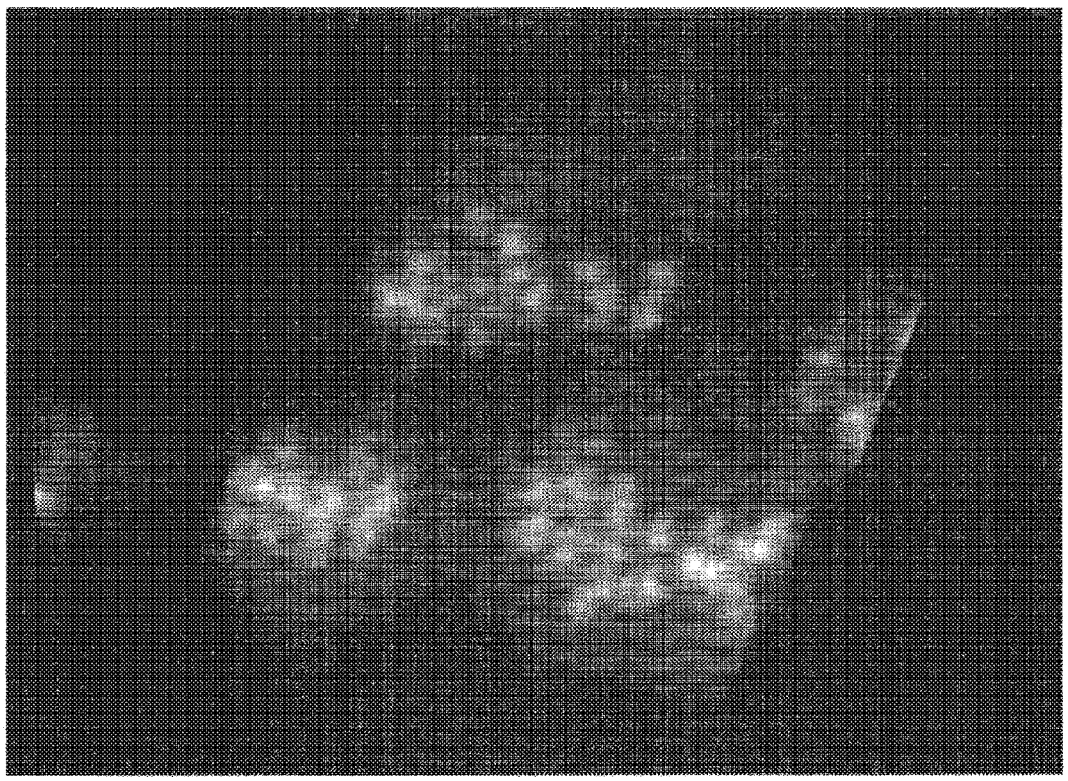
FIG. 3 A projection view (two-dimensional image) obtained by projecting, in one direction, a three-dimensional tomography image of the fluorescent fine particles prepared in Example 1. Silica glass components are pale white. The view shows dark white semiconductor nanoparticles in the silica glass components. In regard to the scale of the view, the average particle size (diameter) of one semiconductor nanoparticle is 5.5 nm.

In order to search for the conditions under which a decrease in the PL efficiency is not observed as described above, the conditions for the above experiment were slightly changed. FIG. 2 shows plots of relative values of the PL efficiency obtained by dispersing a slight amount of water in TEOS, and stirring for 3 hours. In the above-described experiment, the water concentration was 0 M (M is mol/L), and it is clear that a decrease in the PL efficiency begins around when the concentration exceeds 0.005 M. When the amount of water is large, the hydrolysis rate is increased. Because TEOS is a tetrafunctional alkoxide, TEOS hydrolysate that coats the nanoparticle surface is also subjected to hydrolysis at two or more positions, and hydrolysates tend to bind to each other. Further, hydrolysis products are continuously attached to the surface, causing the ligands on the surface to be randomly arranged; this is considered to have led to a decrease in the PL efficiency. TEOS is known to be gradually hydrolyzed by absorbing moisture in the air, even when water is not added.

In step 2, 3-mercaptopropyltrimethoxysilane (MPS, 1 μL) was mixed with ethanol (25 mL) and aqueous ammonia (4 mL, ammonia concentration 10 wt %), thereby obtaining aqueous solution B. The aqueous solution B was mixed with the organic solution A, and stirred for 3 hours. As a result, the semiconductor nanoparticles were transferred to the aqueous phase; further, nanoparticle assemblies were formed in the aqueous phase. These assemblies were extracted by centrifugation. Herein, when TEOS was used instead of MPS, the assembly's size rapidly increased in the aqueous phase, causing white turbidity. This shows that MPS has an effect of adjusting the assembly size.

In step 3, 0.5 mL of aqueous solution in which the above-described assemblies are dispersed was extracted, and ethanol (8 mL), aqueous ammonia (0.1 mL, 25 wt %), and TEOS (14 μL) were added thereto. Thereby, a silica glass layer was formed on the surface of the semiconductor nanoparticle assemblies, and in this way, fluorescent silica glass fine particles were obtained. Further, nanoparticles were dispersed at a concentration of about 1 μM therein. The PL efficiency measured at this time was 31%. The PL efficiency remained the same even when the above solution was redispersed at a nanoparticle concentration of 10 nM in a pH 7.4 HEPES solution (HEPES concentration: 10 mM). Further, an equivalent level of PL efficiency was obtained even when the solvent was evaporated to give a dry powder, and the PL efficiency of the dry powder was measured using an integrating sphere.

Further, for the purpose of developing a network structure of the silica glass layer, the process in step 3 described above was performed at 40° C. to prepare silica glass fine particles.

The amount (weight) of dissolved cadmium was measured in the same manner described below. Table 1 shows the results.

<Quantitative Determination of Dissolved Cadmium>
Preparation of HEPES Buffer Solution 4.766 g of powder of commercially available HEPES (Dojindo 348-01372 produced by Dojindo Laboratories) was dissolved in ultrapure water (160 mL). Next, 1N aqueous sodium hydroxide was gradually added thereto to adjust the pH to 7.4. Further, ultrapure water was added thereto to obtain an amount of 200 mL, and the resulting product is stored as a stock solution in a refrigerator at about 4° C. An amount of 10 mL was extracted from this stock solution, and diluted with ultrapure water to obtain an amount of 100 mL. Thereby, 10 mM of HEPES buffer solution was prepared.

Measurement of Dissolved Cadmium

The above-described HEPES solution (3 mL) was placed in a container made of polypropylene. The prepared silica glass fine particles were added thereto, and the concentration X of the semiconductor nanoparticles was adjusted to 50 nM. The PL efficiency was about 31%, which was the same before and after dispersion. The thus-obtained product was allowed to stand at room temperature for 15 hours. At this stage, the PL efficiency was measured again, and the measurement gave substantially the same value. 3 mL thereof was extracted and centrifuged at 10,000 rpm for 5 minutes using a centrifugal concentration filter (Vivaspin 6, 3000-MWCO produced by Sartorius), and only the solution components that do not contain the silica glass fine particles were extracted by filtration, and placed in a minitube made of polypropylene. The minitube was tightly sealed, and the filtrate was used as a sample. Subsequently, the filtrate was stored in a refrigerator at 4° C. to prevent decomposition.

At this time, because the amount of dissolved cadmium was as small as some parts per billion (some nanograms in 1 mL solution), contamination caused by different factors must be removed to the greatest possible extent. This time, a container made of polypropylene was used as a container for a dissolution test, and a control experiment was separately preformed without placing semiconductor nanoparticles in the container to confirm that the amount of dissolved cadmium was equal to or below the detection limit (0.2 ppb). After confirmation, the sample was used in the experiment. Caution is necessary because analytical accuracy will decrease when molybdenum coexists in the solution.

Quantitative determination of the cadmium ion concentration in the filtrate was performed by the following procedure.

First, the sample solution (0.1 mL) was pretreated by adding ultrapure water (0.8 mL) and high purity nitric acid (0.1 mL; Tamapure AA-100 (Tama Chemicals Co., Ltd.)), and quantified. Nitric acid is effective in stabilizing elements in the sample and preventing attachment of the sample to the wall of the analyzer. An ICP mass spectrometer (Finnigan ELEMENT2, produced by Thermo Fisher Scientific) was used for the measurement. A standard curve was drawn in advance using a standard sample. Because there was a concern that the measurement error would increase as the concentration of dissolved cadmium decreased, a sample obtained from a solution having a high concentration of dispersed semiconductor nanoparticles was used, and a method in which quantification is performed after the sample is concentrated as needed was effective. In the confirmation of accuracy of the measurement that used a standard sample having a known concentration, the measurement error was confirmed to be within 10% even near the lower limit of quantification (the weight in 1 mL sample is 0.5 ng and 0.5 ppb). Further, although a solution obtained from the semiconductor nanoparticles at a concentration of 50 nM was used as a sample this time, it was confirmed that the concentration of the semiconductor nanoparticles and the concentration of dissolved Cd ions in the sample are in a proportional relationship at least in the range where the semiconductor nanoparticle concentration is up to 100 nM.

Next, the same test was performed on commercially available polymer-coated CdSe/ZnS nanoparticles. The following 3 types of nanoparticles by Invitrogen, i.e., Q21321MP (the surface is COOH), Q10021MP (the surface is streptavidin), and Q25021MP (commonly called "Qtracker"; the surface is peptide) were provided, and each type was dispersed in a HEPES buffer solution prepared by the above-described procedure under conditions in which the concentration X was 20 nM. Then, the amount Y (a value when the unit is expressed in nanograms, which corresponds to a value expressed in parts per billion) of cadmium dissolved in 1 mL solution extracted from the above-obtained solution 15 hours after dispersion was measured.

A formula, $Z=10 \times Y/X$, may be used to convert the dissolution amount Y of each type to a dissolution amount Z at a dispersed semiconductor nanoparticle concentration of 10 nM. The Z was as shown based on the Cd weight concentration in Table 1. Specifically, in the table, the Cd weight concentration expressed in ppb is Z. It is clear from this table that the formula $10 \times Y/X<1$ is satisfied only by the fluorescence silica glass fine particles.

TABLE 1

Amount of cadmium dissolution from silica glass fine particles in which CdSe/ZnS nanoparticles are dispersed and from commercially available polymer-coated CdSe/ZnS nanoparticles (when the concentration of dispersed nanoparticles is 10 nM) Amount of Cd Dissolution from Nanoparticles (CdSe/ZnS, 10 nM) in HEPES

| Type | Cd weight concentration (ppB) | Relative ratio | Remarks |
| --- | --- | --- | --- |
| Q21321MP | 1.9 | 1 | COOH-coated |
| Q10021MP | 8.2 | 4.82 | Streptavidin-conjugated |
| Q25021MP | 8.7 | 5.12 | Qtracker, peptide-coated |
| Silica fine particles | 0.41 | 0.24 | OH-coated |
| Silica fine particles prepared at 4° C. | 0.14 | 0.08 | OH-coated |

Example 2

Hydroxyl groups are present on the surface of the silica glass fine particles prepared in Example 1. In order to apply the silica glass fine particles as fluorescent probes in the field of biotechnology, the surface of the silica glass fine particles were modified with various functional groups; and further, antibodies were conjugated thereto.

When MPS was used after the formation of a silica glass layer in Example 1, fine particles coated with thiol groups were prepared.

The fine particles after the formation of the silica glass layer were dispersed in pure water, and 0.5 mL of fine particles (nanoparticle concentration of 1 µM) was extracted and added to a mixture of MPS (2 µL) and ethanol (30 µL). After stirring, precipitate was obtained by centrifugation, washed with pure water, and dispersed in a PBS (concentration: 10 µM) solution to obtain an amount of 0.5 mL. 0.1 mL was extracted therefrom, and a PBS buffer solution (10 µL) in which the concentration of streptavidin-conjugated maleimide was adjusted to 200 mM at 4° C. was mixed with the above-described solution in which the silica glass fine particles are dispersed. Subsequently, precipitate was obtained by centrifugation, washed with a PBS buffer solution, and redispersed again in the PBS buffer solution. Biotinylated secondary antibodies were added to the resulting product to allow binding to various primary antibodies. The fact that the surface modification and attachment to the antibodies were actually carried out was confirmed by the difference in the electrophoretic velocity. As an example of biological applications, embryonic rat hippocampal neurons (E18) were able to be stained using anti-microtubule-associated proteins as primary antibodies.

As another example, after bovine serum albumin was bound to the surface of streptavidinylated silica glass fine particles to remove non-specific adsorption, the silica glass fine particles were bound to biotinylated antibodies against anti-influenza A antigens. When the thus-obtained product was used as a fluorescent probe (fluorescence reagent) in immunochromatography, it was possible to determine whether influenza type A antigen is present in the sample from the fluorescence intensity of a test line.

<Determination of the Particle Size of Silica Glass Fine Particles and the Number N of Dispersed Nanoparticles by Electron Microscope Observation>

After discharge treatment was applied to high resolution carbon-support film grids produced by Okenshoji Co., Ltd. (made of Cu, grid pitch of 100 µm), one drop of the aqueous solution having silica glass fine particles dispersed therein prepared in Example 1 was dropped to allow a slight amount of fine particles to be adsorbed on the surface, thereby preparing an observation grid.

Observation by a transmission electron microscope (produced by Topcon Corporation, EM-002B, accelerating voltage 200 kV) found that the average particle size of silica glass fine particles was about 47 nm. When the particle size is around 47 nm, electrons pass through the fine particles in transmission electron microscope observation. Therefore, it was relatively easy to count the number of semiconductor nanoparticles incorporated. However, when the particles are overlapped in the forward direction of the electron beam, there is a case where count loss occurs. In order to avoid such a situation, it is effective to determine that there is an overlap when a discontinuous circumference is observed from the shape of the particles. 30 silica glass fine particles were randomly selected, and the images thereof were taken. Then, the number of semiconductor nanoparticles distributed therein was counted. In this way, a substantially accurate average distribution number $N_2$ was determined to be 22.

For higher accuracy, it is effective to take 3D images. Using a Tecnai G2F20 (accelerating voltage: 200 kV) produced by FEI Company, a series of dark-field images was taken at 79,000-fold magnification while rotating the sample one degree at a time, in the range of ±64 degrees. Reconstruction of a 3D image was performed from these images using software (Inspect 3D) produced by FEI Company, and an imaging process was performed using software (Avizo5) produced by MCS Inc. While rotating the thus-created 3D image, the number of semiconductor nanoparticles distributed in 60 randomly selected silica glass fine particles was counted, and the accurate average distribution number $N_3$ was determined to be 23. The reason why $N_2$ observed in 2D is slightly lower than $N_3$ observed in 3D is assumed to be because minor count loss occurs due to overlapping of nanoparticles.

<Determination of the Number of Dispersed Nanoparticles by Chemical Analysis>

The chemical compositions of both silica glass fine particles and semiconductor nanoparticles (CdSe/ZnS) prepared in Example 1 were analyzed, thereby calculating the number of semiconductor nanoparticles dispersed in each silica glass fine particles.

After weighing a dry powder sample (about 4 mg in the case of silica glass fine particles, and about 2 mg in the case of only CdSe/ZnS nanoparticles) enveloped in paper for wrapping powdered medicine, the sample was placed in a Teflon (registered trademark) container; hydrofluoric acid and nitric acid were simultaneously added thereto, and the container was sealed. Subsequently, the sample was dissolved by heating at about 200° C. using a microwave sample pretreatment device (Milestone General). After sufficient cooling, the resulting product was taken out and diluted with ultrapure water. Subsequently, using a high-frequency induction-coupled plasma quantometer (ICP-AES, Nippon Jarrell Ash Co., Ltd., the current company name is Thermo Fisher Scientific K.K., IRIS Advantage), Cd, Se, Zn, S, and Si in the solution were quantified. A standard curve was drawn for each element, using a sample whose concentration is already known. In this way, it was ensured that the analytical error would be within 10%.

As a result, the analysis results shown in Table 2 were obtained.

TABLE 2

Composition Ratio of Constituent Elements of Silica Glass Fine Particles and CdSe/ZnS Nanoparticles

| Sample | Dry weight/mg | Molar Ratio | | | | |
| --- | --- | --- | --- | --- | --- | --- |
| | | Cd | Se | Zn | S | Si |
| Sample 1 Silica fine particles (CdSe/ZnS nanoparticles are dispersed) | 4 | 1 | 0.23 | 2.39 | 3.31 | 28.99 |
| Sample 2 CdSe/ZnS nanoparticles | 2 | 1 | 0.25 | 1.46 | 1.97 | 0 |

The following procedure is performed to calculate the number N of semiconductor nanoparticles dispersed in one silica glass fine particle from the above results.

First, based on the observation of transmission electron microscope images, the average particle size of one silica glass fine particle was 47 nm, and the average particle size of semiconductor nanoparticles was 5.8 nm. Additionally, based on the speculations in known literature (Advanced Materials, Vol. 21, p. 4016, 2009; and New Journal of Chemistry, Vol. 33, p. 561, 2009), the density of silica glass fine particles was 1.5 g/cm$^3$. With the size of the above-obtained semiconductor nanoparticles, 30% or more of atoms would be located on the surface, and there would be a deviation from the stoichiometric composition ratio. In order to accurately estimate the number of semiconductor nanoparticles dispersed in each silica glass fine particle regardless of such deviation, a measurement must be made by the calculation as described below.

From the analysis results of sample 2 in Table 2, the atomic weights of cadmium selenide and zinc sulfide, which constitute the nanoparticles, are determined to be 131.8 and 158.9, respectively, assuming that their compositions are $Cd_1Se_{0.25}$ and $Zn_{1.46}S_{1.97}$, respectively. Further, the atomic weight of Si is determined to be 1737, assuming that every Si is present in the form of $SiO_2$. Here, by using the specific gravity of each substance, the volume ratio can be determined as follows: $CdSe:ZnS:SiO_2=32.1:27.4:1157.8$ in the silica glass fine particle. Accordingly, the volume fraction of the semiconductor nanoparticles in the silica glass fine particle is 0.049 (=(32.1+27.4)/(32.1+27.4+1157.8)). Based on the volume of one silica glass fine particle and the above-described volume fraction, the volume of CdSe/ZnS nanoparticles in the silica glass fine particle is determined to be 2660 $nm^3$, and the volume of one nanoparticle is 102 $nm^3$. Accordingly, the number N of the semiconductor nanoparticles in one silica glass fine particle was determined to be 26.

Example 3

When the amount of MPS used in "Synthesis of Silica Glass Fine Particles" in Example 1 was decreased to 0.5 μL, the size of nanoparticle assemblies formed was increased. The surface of these assemblies was coated with silica glass in the same manner as in Example 1, thereby obtaining fluorescent fine 0.15 particles. At this time, the PL efficiency when the semiconductor nanoparticles were dispersed at a concentration of 10 nmol/L in a HEPES solution was about 25%. It was found by electron microscope observation that the fluorescent fine particles have an average particle size of 95 nm. Further, it was confirmed that at least 160 nanoparticles are dispersed.

Example 4

When the amount of MPS used in "Synthesis of Silica Glass Fine Particles" in Example 1 was increased to 2 μL, the size of nanoparticle assemblies formed was decreased. The surface of the assemblies was coated with silica glass in the same manner as in Example 1, thereby obtaining fluorescent fine particles. At this time, when the semiconductor nanoparticles were dispersed at a concentration of 10 nmol/L in a HEPES solution, the PL efficiency was about 25%. It was found by electron microscope observation that the fluorescent fine particles have an average particle size of 21 nm. Further, it was confirmed that at least 11 nanoparticles are dispersed.

Example 5

It was also possible to modify the surface with a carboxyl group or a salt thereof by using carboxyethylsilanetriol sodium salt (abbreviated as CES).

Specifically, TEOS was mixed with CES at a molar ratio of 5% of TEOS, followed by stirring for 48 hours. The resulting mixture was added in step 3 in Example 1, instead of pure TEOS, thereby obtaining fluorescent fine particles whose surface is modified with a sodium salt of a carboxyl group.

In a similar manner, aminopropyltrimethoxysilane was used, and thereby the surface was able to be modified with an amino group. Water-soluble carbodiimide was acted thereon to allow binding to the carboxyl groups on the cell surface.

Example 6

After the fluorescent fine particles prepared in Example 1 were vacuum-dried, the fluorescent fine particles were bound to a glass substrate. When irradiated with a commercially available light-emitting diode (emission wavelength: 385 nm), the fluorescent fine particles showed a red-light emission. Likewise, fluorescent fine particles that showed a blue-light emission and a green-light emission were also obtained by decreasing the average particle size of nanoparticles embedded. Specifically, fluorescent fine particles with a blue-light emission are obtained when the average particle size of CdSe/ZnS nanoparticles is about 3.3 nm (the thickness of the ZnS shell is about 0.5 nm, and the size of the CdSe core is about 2.3 nm), and fluorescent fine particles with a green-light emission are obtained when the average particle size of CdSe/ZnS nanoparticles is about 5.1 nm (the thickness of the ZnS shell is about 0.5 nm, and the size of the CdSe core is about 4.1 nm). Further, the nanoparticles with a red-light emission (peak wavelength: about 620 nm) used in Example 1 had an average particle size of about 5.5 nm. Because the emission color is determined based on both core size and shell thickness, there is a case where the emission color is different even when the average particle size is same. The average particle size of the nanoparticles can be adjusted by the reaction time during synthesis by a known solution method. It was found that these fluorescent fine particles are also usable as fluorescent materials for electronic materials such as lights and displays.

Example 7

The difference among prepared products by synthesis conditions was systematically investigated. The experiment was performed in the same manner as in Example 1. Table 3 shows synthesis conditions for steps 2 and 3, the PL efficiency of the synthesis products, and the particle size of the silica glass fine particles. The reaction time in the table shows the reaction time in step 3.

TABLE 3

Synthesis Conditions for Steps 2 and 3, and the PL Efficiency and the Particle Size of Prepared Fluorescent Silica Glass Fine Particles

| Silica glass fine particle number | Synthesis Conditions | | | Results | |
| --- | --- | --- | --- | --- | --- |
| | TEOS/semi-conductor nanoparticles (molar ratio) | Molar concentration of MPS | Reaction time (h) | PL efficiency (%) | Particle size of silica glass fine particles (nm) |
| (1) | $2.81 \times 10^5$ | $4.7 \times 10^{-5}$ | 4.0 | 22 | 95 ± 9 |
| (2) | $2.39 \times 10^5$ | $9.4 \times 10^{-5}$ | 3.5 | 34 | 46 ± 6 |
| (3) | $1.32 \times 10^5$ | $9.4 \times 10^{-5}$ | 3.0 | 33 | 40 ± 5 |
| (4) | $2.68 \times 10^5$ | $9.4 \times 10^{-5}$ | 4.0 | 30 | 47 ± 7 |

Figure 4:
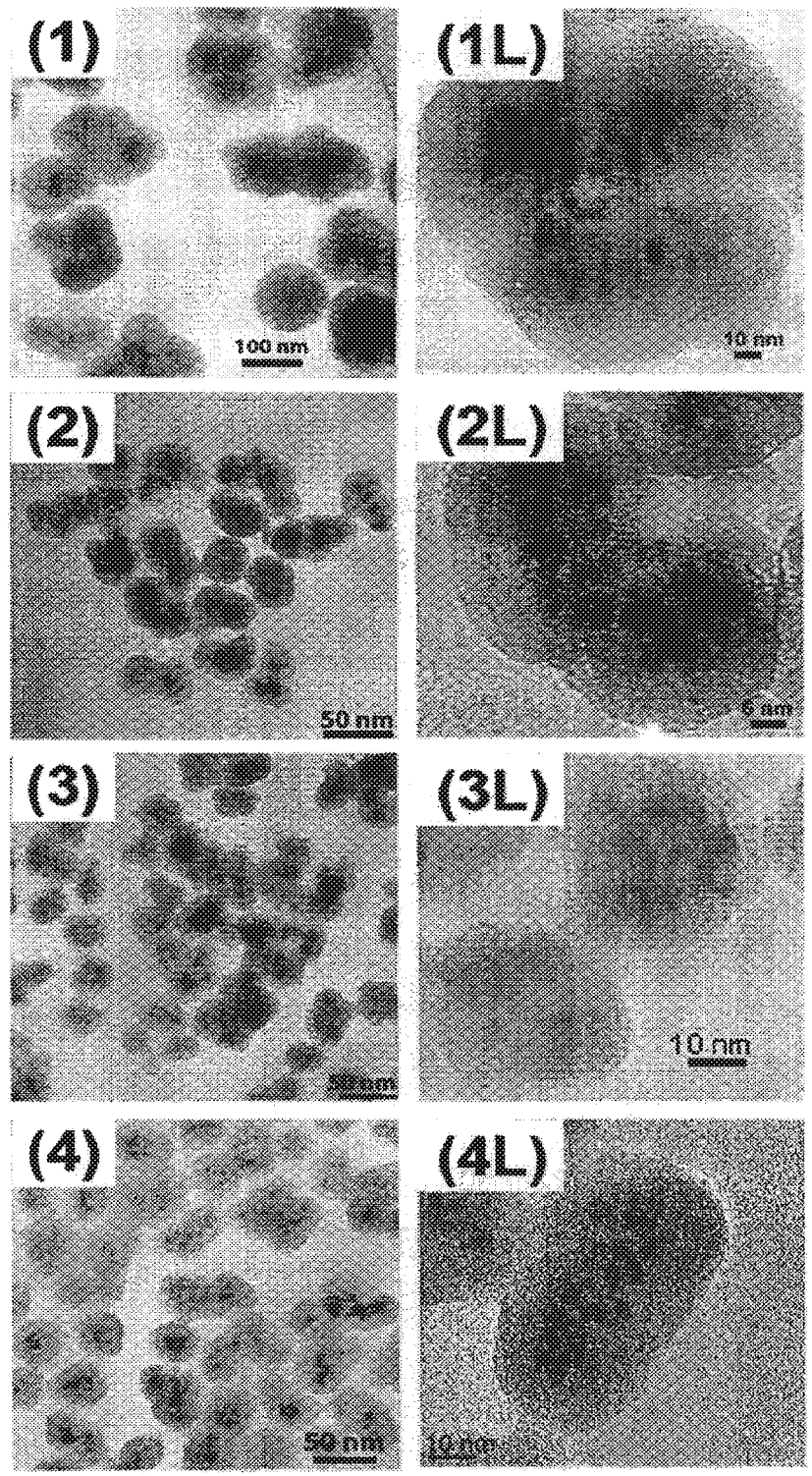
FIG. 4 Transmission electron microscope images of silica glass fine particles (1) to (4) prepared in Example 7. The images (1L) to (4L) on the right side are enlarged images of (1) to (4), respectively.

FIG. 4 shows transmission electron microscope images of synthesized silica glass fine particles (1) to (4). The figure numbers (1L), (2L), (3L), and (4L) show enlarged images of the silica glass fine particles (1), (2), (3), and (4), respectively.

It is clear from these figures that these particles individually have a silica glass layer thickness of 20 nm, 10 nm, 7 nm, and 13 nm. Among the synthesis conditions for silica glass fine particles (1) in Table 3, when the molar concentration of MPS was increased to $5.0 \times 10^{-5}$ mol/L, the silica glass fine particles had a PL efficiency of 25% and a particle size of 90±9 nm.

Example 8

The modified preparation method described in "Solution to Problem" was used.

MPS (0.5 µL), ethanol (25 µL), and TEOS (2 µL) were added to a toluene solution of CdSe/ZnS nanoparticles (0.5 mL; concentration of 1.5 µM), and the mixture was stirred for 2 days. In this step 1, nanoparticles coated with TEOS and MPS were prepared.

Figure 5:
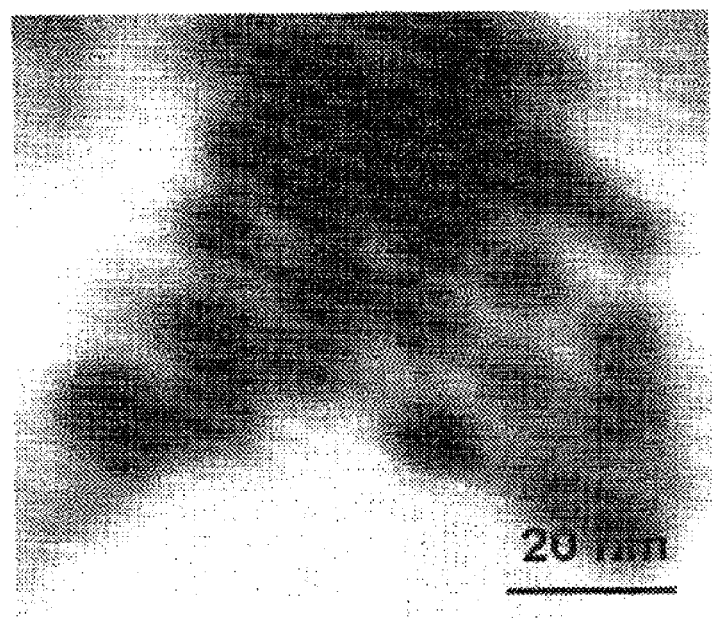
FIG. 5 A transmission electron microscope image of an assembly in which nanoparticles prepared in Example 8 are regularly arranged. The surface of the assembly can be coated with a layer of silica glass.

In next step 2, ethanol (4 mL) and water (0.1 mL) were added to the above solution, and further, TEOS (10 µL) and aqueous ammonia (6.3 wt %, 0.3 mL) were gradually added thereto. Thereby, alkoxide attached to the surface of nanoparticles prepared in step 1 was hydrolyzed, became hydrophilic, and formed an assembly by coming into contact with TEOS while moving in the aqueous solution. After stirring for 3 hours and 30 minutes, particles were taken out by centrifugation and observed under a transmission electron microscope. FIG. 5 shows the results. FIG. 5 shows that the nanoparticles in the assembly are regularly arranged, compared to, for example, FIG. 4. In this case, about 30 nanoparticles are observed in the assembly. The PL efficiency was about 25%. Because of such regular arrangement, it was possible to increase the concentration of nanoparticles dispersed in each glass bead, and glass beads with high brightness were thereby obtained. The emission wavelength was 652 nm. The particle size of the glass beads was about 70 nm.

Further, in step 3, the surface of the glass beads was able to be coated with a silica glass layer. The final particle size of the glass beads was about 90 nm.

Example 9

A toluene dispersion of CdSe/ZnS nanoparticles (concentration: 1.5 µmol/L; volume: 0.4 mL) having an emission wavelength of 610 nm was taken out; and further, TEOS (10 µL) and MPS (0.05 µL) were added thereto. The mixture was stirred for 3 hours, thereby obtaining organic solution A. Separately, MPS (0.15 µL), ethanol (25 mL), aqueous ammonia (6.25 wt %, 1.5 mL), and water (2 mL) were mixed, thereby obtaining aqueous solution B. When the organic solution A was mixed with the aqueous solution B, the nanoparticles moved from the organic solution to the aqueous solution. By further stirring the mixture for 3 hours, a nanoparticle assembly was obtained. At this stage, the size of the nanoparticle assembly was 25 nm, and the number of nanoparticles in the assembly was about 15. Further, a silica glass layer was formed by the method of step 3 in Example 1, using TEOS by the Stöber method. The final size of the glass beads was about 30 nm. Further, the PL efficiency was 25%.

The invention claimed is:

1. A method of preparing fluorescent fine particles comprising Cd- and Se-containing semiconductor nanoparticles dispersed in silicon-containing fine particles, comprising the steps of:
   (A) adding a metal alkoxide (1) containing silicon as metal to an organic solvent in which Cd- and Se-containing lipophilic semiconductor nanoparticles are dispersed, and stirring the mixture, thereby the nanoparticle surface is coated by a hydolysate of the metal alkoxide (1), thereby obtaining organic solution A;
   (B) mixing aqueous solution B containing a metal alkoxide (2) containing silicon as metal whose hydrolysis rate is lower than that of the metal alkoxide (1) with the organic solution A and stirring the mixture, thereby obtaining an semiconductor nanoparticle assembly; and
   (C) adding an alcohol to an alkaline aqueous solution containing the semiconductor nanoparticle assembly, and subsequently a solution of metal alkoxide (3) containing silicon as metal to the solution, thereby forming a coating layer on the surface of the semiconductor nanoparticle assembly,
   wherein each fluorescent fine particle comprises 10 or more number of Cd- and Se-containing semiconductor nanoparticles, and the average particle size of the fluorescent fine particles is 20 to 100 nm.

2. The method of preparing fluorescent fine particles according to claim 1, wherein the metal alkoxide (2) is a compound represented by Formula (II):

$$X_n\text{—Si}(OR^2)_{4-n} \quad (II)$$

wherein X represents a group represented by $CH_2$=CH—, a group containing oxirane, a group represented by $H_2NC_mH_{2m}$—, a group represented by $CH_2$=$C(CH_3)COOC_pH_{2p}$—, a group represented by $HSC_qH_{2q}$—, or a phenyl group; $R^2$ represents a lower alkyl group; n is an integer of 1, 2, or 3; m is an integer of 1 to 6; p is an integer of 1 to 5; and q is an integer of 1 to 10.

3. The method of preparing fluorescent fine particles according to claim 1, wherein heating is performed during Step (C).

4. A method of preparing fluorescent fine particles comprising Cd- and Se-containing semiconductor nanoparticles dispersed in silicon-containing fine particles, comprising the steps of:
   (A1) adding a metal alkoxide (1) containing silicon as metal and a metal alkoxide (2) containing silicon as metal whose hydrolysis rate is lower than that of the metal alkoxide (1) to an organic solvent in which Cd- and Se-containing lipophilic semiconductor nanoparticles are dispersed, and stirring the mixture, thereby the nanoparticle surface is coated by a hydolysate of the metal alkoxide (1), thereby obtaining organic solution A; and
   (B1) adding an alcohol, a metal alkoxide (3) containing silicon as metal and an alkaline aqueous solution to the organic solution A, thereby forming a semiconductor nanoparticle assembly,
   wherein the average particle size of the fluorescent fine particles is 20 to 100 nm.

5. A method of preparing fluorescent fine particles comprising Cd- and Se-containing semiconductor nanoparticles dispersed in silicon-containing fine particles, comprising the steps of:
   (A2) adding two types of metal alkoxides containing silicon as metal to a non-polar solvent in which Cd- and Se-containing lipophilic semiconductor nanoparticles are dispersed, and stirring the mixture, thereby the nanoparticle surface is coated by hydrolysates of the metal alkoxides, thereby obtaining organic solution X; and
   (B2) bringing the organic solution X into contact with solution Y containing an alcohol, a metal alkoxide containing silicon as metal and water so as to transfer the semiconductor nanoparticles in the organic solution X to the solution Y, thereby forming a semiconductor nanoparticle assembly; and
   (C) adding an alcohol to an alkaline aqueous solution containing the semiconductor nanoparticle assembly, and subsequently a solution of metal alkoxide (3) containing silicon as metal to the solution, thereby forming a coating layer on the surface of the semiconductor nanoparticle assembly,
   wherein each fluorescent fine particle comprises 10 or more number of Cd- and Se-containing semiconductor nanoparticles, and the average particle size of the fluorescent fine particles is 20 to 100 nm.

* * * * *